United States Patent
Thallner et al.

(10) Patent No.: US 11,460,777 B2
(45) Date of Patent: Oct. 4, 2022

(54) METHOD AND DEVICE FOR EXPOSURE OF PHOTOSENSITIVE LAYER

(71) Applicant: EV Group E. Thallner GmbH, St. Florian am Inn (AT)

(72) Inventors: Bernhard Thallner, St. Florian am Inn (AT); Boris Povazay, Vienna (AT)

(73) Assignee: EV Group E. Thallner GmbH, St. Florian am Inn (AT)

( * ) Notice: Subject to any disclaimer, the term of this patent is extended or adjusted under 35 U.S.C. 154(b) by 0 days.

(21) Appl. No.: 16/470,709

(22) PCT Filed: Dec. 20, 2016

(86) PCT No.: PCT/EP2016/081880
§ 371 (c)(1),
(2) Date: Jun. 18, 2019

(87) PCT Pub. No.: WO2018/113917
PCT Pub. Date: Jun. 28, 2018

(65) Prior Publication Data
US 2020/0089121 A1    Mar. 19, 2020

(51) Int. Cl.
*G03F 7/20* (2006.01)

(52) U.S. Cl.
CPC ........ *G03F 7/2057* (2013.01); *G03F 7/70633* (2013.01)

(58) Field of Classification Search
CPC ............... G03F 7/2057; G03F 7/70633; G03F 7/70558; G02B 26/0833
See application file for complete search history.

(56) References Cited

U.S. PATENT DOCUMENTS

| | | |
|---|---|---|
| 5,745,459 A | 4/1998 | Inokuchi et al. |
| 6,897,941 B2 | 5/2005 | Almogy |
| 6,903,798 B2 | 6/2005 | Shirota et al. |
| 7,167,296 B2 | 1/2007 | Meisburger |
| 8,390,790 B2 | 3/2013 | Mangold et al. |
| 9,052,608 B2 | 6/2015 | Wijnaendts Van Resandt et al. |
| 2006/0269217 A1 | 11/2006 | Shirota et al. |

(Continued)

FOREIGN PATENT DOCUMENTS

| | | |
|---|---|---|
| CN | 1791839 A | 6/2006 |
| CN | 102338989 A | 2/2012 |

(Continued)

OTHER PUBLICATIONS

Google translation of DE 102005054000, Jun. 2006.*

(Continued)

*Primary Examiner* — Peter B Kim
(74) *Attorney, Agent, or Firm* — Kusner & Jaffe

(57) ABSTRACT

A method and device for exposing a light-sensitive layer, said method comprising: generating at least one light ray by use of at least one light source, illuminating pixels of an exposure pattern by use of at least one micromirror device having a plurality of micromirrors with respective mirror intensity profiles, and overlaying the mirror intensity profiles of adjacent micromirrors to provide a pattern intensity profile of the exposure pattern by summing the mirror intensity profiles of each illuminated pixel of the exposure pattern.

16 Claims, 8 Drawing Sheets

(56) References Cited

U.S. PATENT DOCUMENTS

| | | | |
|---|---|---|---|
| 2007/0279606 A1* | 12/2007 | Nagasaka | G03F 7/706 |
| | | | 355/40 |
| 2008/0062398 A1 | 3/2008 | Hisaoka et al. | |
| 2008/0231826 A1 | 9/2008 | Desmedt et al. | |
| 2008/0313593 A1 | 12/2008 | Seo et al. | |
| 2010/0091256 A1 | 4/2010 | Mangold et al. | |
| 2011/0273688 A1 | 11/2011 | Wijnaendts Van Resandt et al. | |
| 2011/0304835 A1 | 12/2011 | Katzir et al. | |
| 2013/0088704 A1 | 4/2013 | Mei et al. | |

FOREIGN PATENT DOCUMENTS

| | | | |
|---|---|---|---|
| DE | 102005054000 A1 | 6/2006 | |
| EP | 0467076 A2 | 1/1992 | |
| EP | 2 658 257 A2 | 10/2013 | |
| JP | 2010-524211 A | 7/2010 | |
| JP | 2016-072434 A | 5/2016 | |
| WO | WO-1997/034171 A2 | 9/1997 | |
| WO | WO-2003/040830 A2 | 5/2003 | |
| WO | WO-2008/122419 A1 | 10/2008 | |
| WO | WO-2010/057740 A1 | 5/2010 | |
| WO | WO-2015074746 A1 * | 5/2015 | G02B 26/0833 |
| WO | WO 2018/041326 A1 | 3/2018 | |

OTHER PUBLICATIONS

Google translation of EP 0467076, Jan. 1992.*
International Search Report from corresponding International Patent Application No. PCT/EP2016/081880, dated Aug. 24, 2017.

* cited by examiner

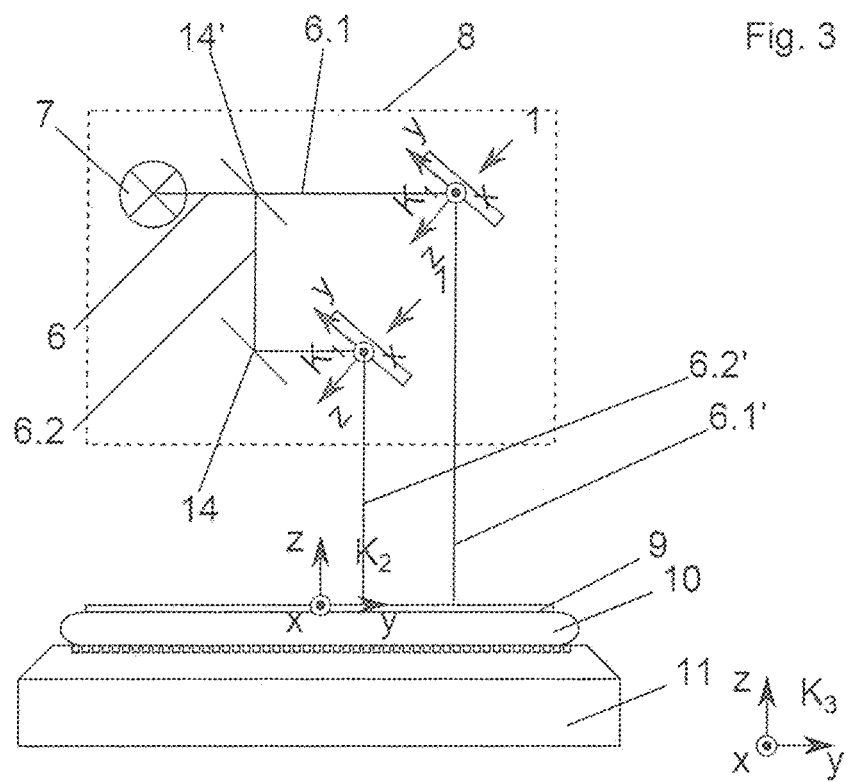

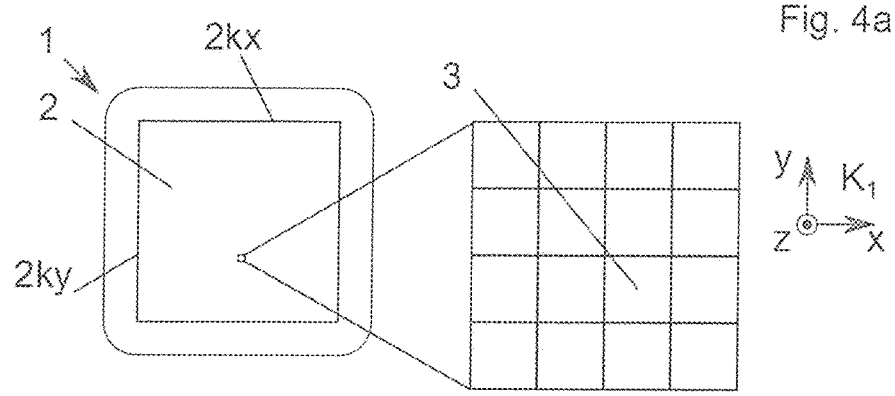
Fig. 4a
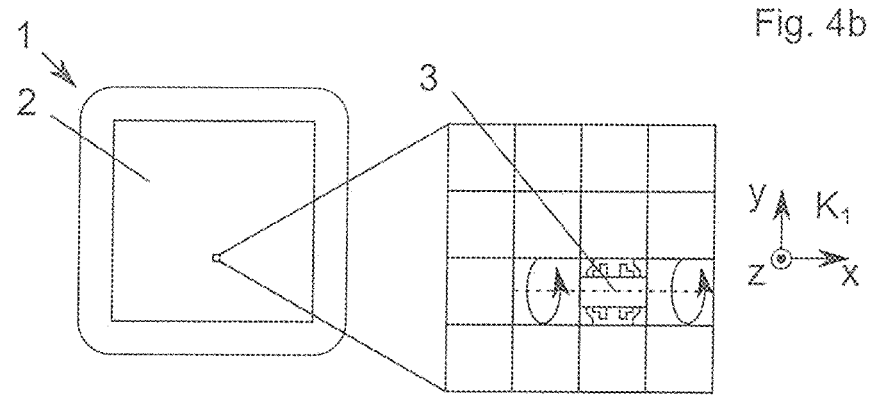
Fig. 4b
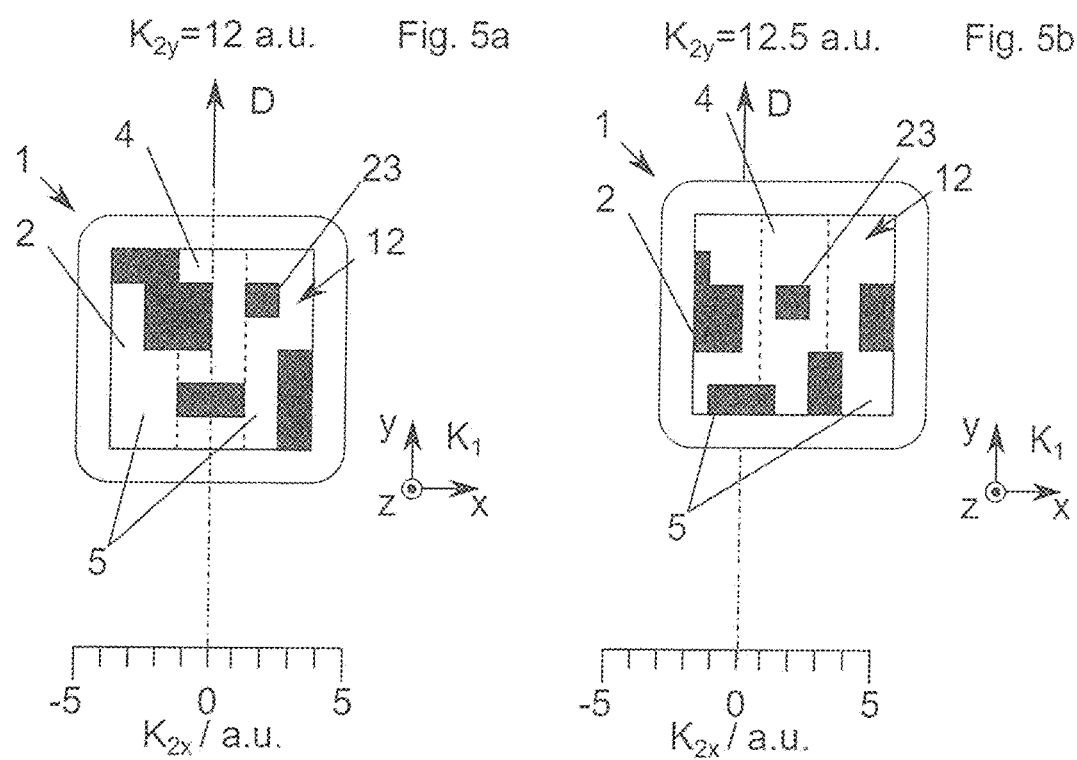

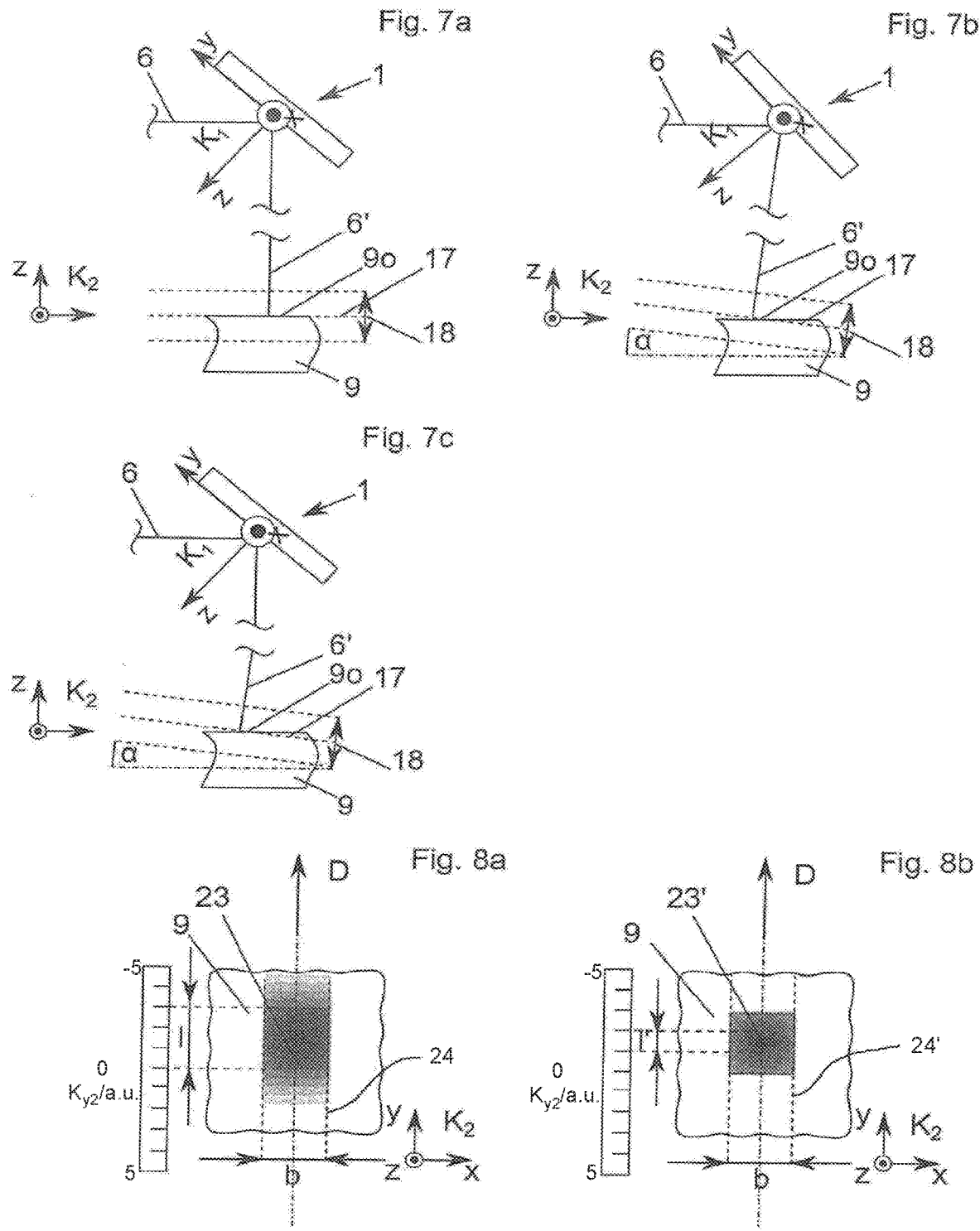

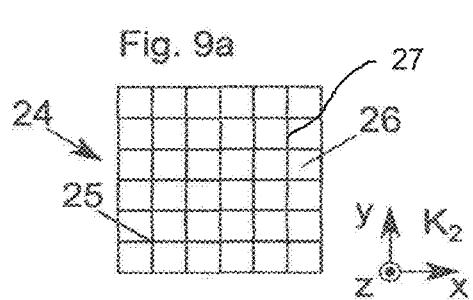 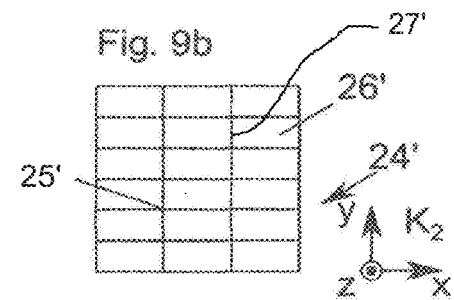 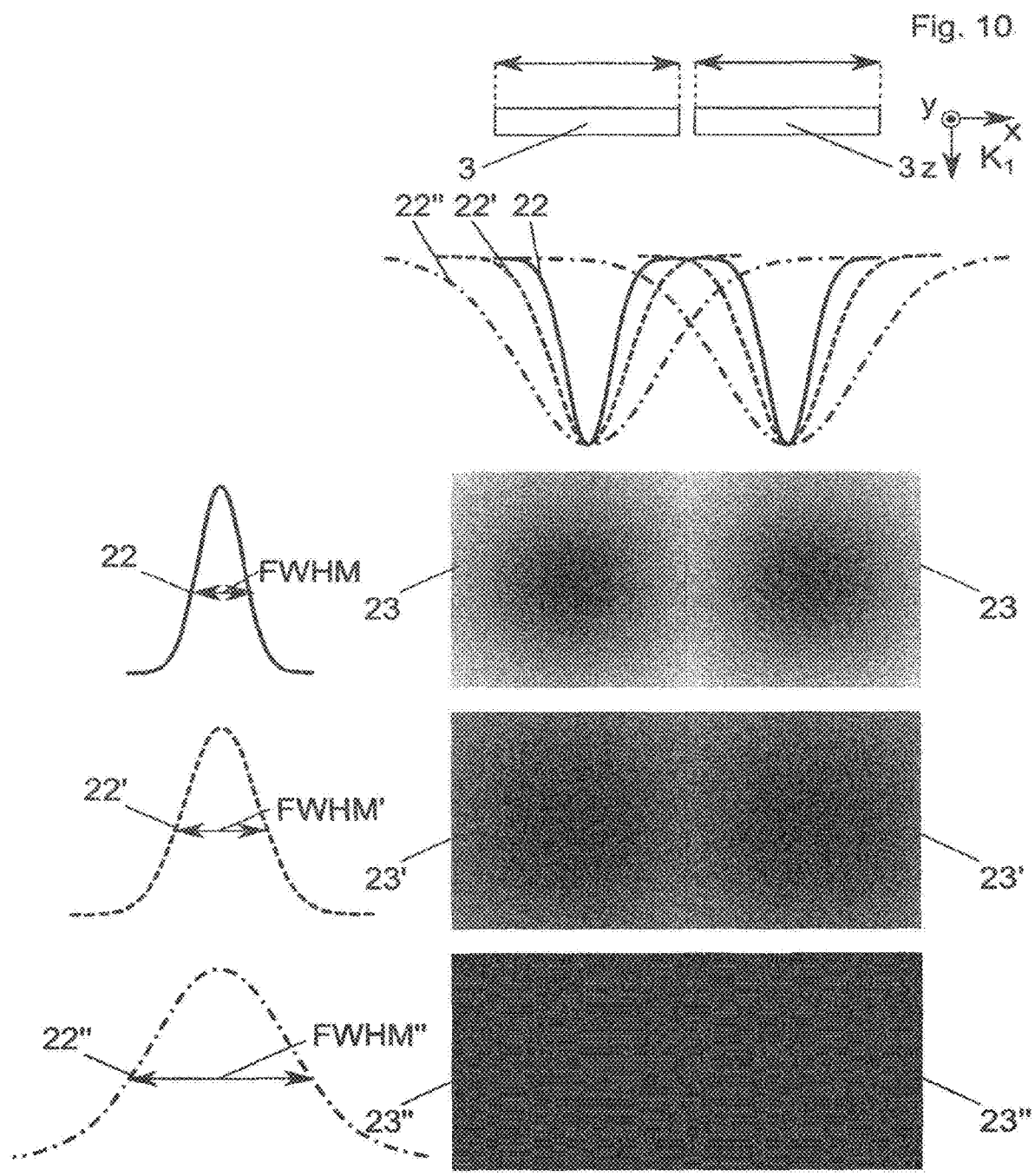

METHOD AND DEVICE FOR EXPOSURE OF PHOTOSENSITIVE LAYER

FIELD OF THE INVENTION

The present invention relates to a method for exposing a light-sensitive layer and a corresponding device.

BACKGROUND OF THE INVENTION

Digital micromirror devices (DMDs) have already been known for a long time in the prior art. These are optical elements comprised of a multiplicity of small mirrors, which can be moved/aligned individually. Each mirror can be electrically controlled and orientated in a targeted manner. As a result, an optical system with a DMD can be used to deflect a wide light ray in a selectively spatially resolved manner. For the most part, only two fully deflected positions are observed per mirror. A mirror either allows the part of the light ray which falls onto it to pass through the optical system further or it reflects the part of the light ray such that the light is not forwarded in the optical system. One can then interpret each mirror of such a DMD as a digital light switch.

DMDs of this type are used in the prior art already, primarily in projectors. Increasingly, DMDs are also used in the industrial field, such as e.g. in 3D printing, 3D measurement and maskless lithography.

In the prior art, only maskless exposure units are known, which have a single light source, which illuminate the DMD and therefore the surface to be exposed.

SUMMARY OF THE INVENTION

It is an object of the present invention to overcome the disadvantages of the prior art and in particular to achieve an improved exposure result.

This object is achieved with the subjects of the coordinate patent claims and also the inventive ideas disclosed in the following. Advantageous developments of the invention are specified in the dependent claims. All combinations of at least two features specified in the description, the claims and/or the drawings also fall within the scope of the invention. In the case of value ranges, values lying within the limits mentioned should also be disclosed as limit values and be claimable in any desired combination.

The invention in particular indicates how an improved, faster, more highly resolved exposure process can be carried out and how, at the same time, an exposure can take place at different depths of focus.

The core idea of the invention comprises constructing micromirrors of a micromirror device of an optical system in such a manner that each mirror intensity profile of the micromirrors is overlaid or is constructed such that it can be overlaid with respectively adjacent mirror intensity profiles. Each mirror intensity profile therefore includes a region corresponding to the pixel and a region surrounding the pixel. The mirror intensity profiles are at least predominantly, preferably completely, defined by the optical elements and by the geometric shape of the micromirrors. The micromirrors are preferably rectangular, more preferably square. Round or triangular micromirrors would also be conceivable. A (DMD) image is formed from the pixels including overlays.

In particular, an exposure pattern is created, made up of a plurality of, at least partially overlaid mirror intensity profiles with a pattern intensity profile. The pattern intensity profile is therefore a sum of the overlaid mirror intensity profiles. The exposure pattern preferably exposes a section of a layer to be exposed on a substrate, wherein the pattern intensity profile of the exposure pattern due to the overlay is preferably more homogeneous than an exposure pattern from the prior art without overlay.

The mirror intensity profile is preferably chosen or adjusted or controlled such that 50% of the energy deflected by the respective mirror impinges onto the corresponding pixel. A further 50% of the energy deflected by the respective mirror is divided onto the pixels surrounding the respective pixel. In a more preferred embodiment according to the invention, the mirror intensity profile is chosen or adjusted or controlled such that more than 50%, more preferably more than 60%, more preferably more than 70%, of the energy deflected by the respective mirror impinges onto the corresponding pixel. The remaining energy is divided onto the pixels surrounding the respective pixel.

In a different, less preferred embodiment according to the invention, the mirror intensity profile is chosen such that less than 50% of the energy deflected by the respective mirror impinges onto the corresponding pixel.

The invention in particular describes a maskless exposure device or a maskless exposure method. The exposure unit is described in a number of embodiments, which can be combined with one another. In particular, these are optimization options, which are independent, but can be combined with one another.

The most important embodiment comprises designing the optical system in such a manner that overlapping of the individual pixels (pixels generated by the optical system) occurs, particularly using overlay and/or interference. This is effected in particular in that the intensity profiles of the reflected rays of the adjacent micromirrors are overlaid.

In particular, a maskless exposure device having at least two light sources is disclosed, wherein the light rays of the light sources in particular are overlaid or combined or mixed.

According to the invention, a maskless exposure device with integrated measurement technology would also be conceivable. A further embodiment relates to a maskless exposure unit, which allows a simultaneous exposure in different focal planes or spectrally different partial images. According to a further alternative embodiment, an exposure unit having an anisotropic or distortive optical system for achieving a higher resolution is disclosed.

A further, particularly independently disclosed implementation relates to the method of "descanning" for increasing throughput and resolution. Here, the in particular continuously or sequentially scanning exposure process is overlaid by a second deflection in one or two directions, which determine the exposure field quasi-statically with a finer positioning accuracy than the pixel size, in order to reduce both motion blur and edge positions.

Furthermore, embodiments are disclosed, in which the optical system generates an orthogonally distorted illustration of the original image (particularly parallel to the surface of the layer to be exposed) between the DMD and the light-sensitive layer to be exposed (material to be exposed). The positional accuracy or the overlay can be increased in particular by means of the optical distortion of the image. One understands the positional accuracy for an existing structure in the specific case to mean that the resolution of the structures to be written is increased by means of the distorted illustration of the original image according to the invention.

Advantages of the Invention

No masks are required, so that the desired structure can be exposed directly into a light-sensitive (photosensitive) layer.

Due to the use of a plurality of light sources, the spectrum can be chosen to be wider, and the light output and therefore the achievable throughput are increased. By tilting the focal plane compared to the surface of the layer to be exposed or by choosing the wavelengths individually, it is possible to expose simultaneously at different depths with full resolution or selectively in different planes.

According to the invention, the device in particular has an optical system with the following features:
- at least one light source for generating at least one light ray,
- at least one micromirror device with a multiplicity of micromirrors, wherein each micromirror is used for illuminating a pixel of an exposure pattern with a mirror intensity profile, wherein the optical system is constructed in such a manner that an overlay of mirror intensity profiles of adjacent micromirrors to form a pattern intensity profile of the exposure pattern takes place as a sum of the mirror intensity profiles of each illuminated pixel of the exposure pattern.

The invention describes a method and a plant, in order to irradiate a light-sensitive layer with the aid of a light ray bundle, particularly a laser, which is conducted through an optical system comprised of at least one, preferably digital, micromirror device (DMD). The irradiation of the layer leads to a physical and/or chemical change of the layer.

The embodiments according to the invention can in particular be conceived as
- whole-area
- continuously scanning
- step-by-step maskless exposure units. "Maskless" is understood to mean that the imaging of a static template (mask, reticle) is replaced by a dynamically optically patterning system.

A whole-area, maskless exposure unit is understood to mean a plant, which has a DMD, which can expose the entire region to be written, without a significant relative displacement between the layer to be exposed and the optical system. Thus, according to the present prior art, only very small substrates can be exposed, as the size of today's DMDs is limited.

A scanning, maskless exposure unit is understood to mean a device or a method, in which the exposure field is smaller than the region to be exposed, so that a relative displacement between the optical system and the layer to be exposed takes place, in order to expose the entire exposure field. This relative displacement in particular takes place continuously along a path. The path is preferably:
- meandering
- in rows with displacement into the next row and reset to the start when the end is reached,
- spiral,
- circular,
- linear.

In particular, the paths mentioned can also be combined with one another. Thus, it is conceivable to first use a spiral path for exposure, followed by a linear path, which in particular leads through the centre of the substrate or a plurality of initially independent writing paths complement one another. The travel is preferably meandering.

A stepped, maskless exposure unit is understood to mean a plant, in which the exposure field is smaller than the region to be exposed, the relative displacement between the optical system and the layer to be exposed takes place step-by-step and no exposure takes place between the individual steps. The optical system only exposes the layer to be exposed when the optical system and the layer to be exposed are located in a well-defined position. This embodiment is therefore concerned with exposing a plurality of sections of the layer to be exposed.

The DMD Principle

A DMD allows the targeted deflection, particularly of a plurality of parts, of a wide primary, preferably parallel and/or non-scattering, ray bundle. As a result, a spatially structured, secondary optical exposure ray bundle can be generated without the aid of a mask. For the most part, optics, particularly projection optics, are installed upstream and/or downstream of the DMD, which optics can manipulate (particularly scale) the primary exposure ray falling onto the DMD and/or the secondary exposure rays reflected by the DMD, and in the case of microlithography in particular can create a reduction in size of the DMD image. As a result, the DMD image can be correspondingly reduced in size.

The thereby achievable structural resolution of a DMD lies in particular between 0.1 µm and 50 µm, preferably between 0.3 µm and 25 µm, more preferably between 1 µm and 10 µm.

Primarily for embodiments in which the individual exposure field is smaller than the substrate, it is important that after a relative movement between the optical system and the layer to be exposed, a seamless continuation of the structures to be generated takes place. This takes place in two independent directions in the case of stepping and for the most part only in one direction in the case of continuous scanning.

The Optical System

The embodiments according to the invention are comprised of at least one optical system, which can contain a plurality of optical elements of different types. At least one of the optical elements is a DMD, although the use of a plurality of DMDs constitutes a further embodiment according to the invention. In particular, there is exactly one DMD, preferably there are at least two DMDs, more preferably there are at least four DMDs in the optical system. The optical system itself can be used in one or more forms parallel on a substrate inside a plant. The parallel exposure of a plurality of substrates inside the plant is also conceivable according to the invention.

The following optical elements may furthermore be included in the optical system:
- illuminating optic
- coherent light sources, particularly
  - laser light sources
    - laser diodes
    - solid-state lasers
    - excimer lasers
- incoherent laser sources, particularly
  - gas discharge lamps, particularly
    - mercury vapour lamps
  - LEDs
- partially coherent light sources
- coherence-changing components
- deflecting optic
- DMDs
- mirrors, particularly
  - cold mirrors
  - hot mirrors
- refracting elements, particularly
  - prisms
  - ray splitters
- projection optic
- lenses, particularly
  - Fresnel lenses
  - refractive lenses convex lenses
concave lenses
biconcave lenses
biconvex lenses
convex-concave lenses
concave-convex lenses
cylindrical lenses
compound lenses mirrors, particularly
cylindrical mirrors
general ray-modifying optical components The light sources can be used continuously or in a pulsed manner and in particular are additionally internally or externally modulated.

The maximum possible relative speed between the optical system and the layer to be exposed is limited in particular by the maximum drive frequency of the DMD (that is to say the frequency with which the individual mirror elements of a DMD can actually be switched). The relative speed in a scanning system is furthermore determined by the displacement and/or deflecting optic and in particular lies between 5 mm/s and 500 mm/s, preferably between 10 mm/s and 250 mm/s, more preferably between 15 mm/s and 200 mm/s, most preferably between 25 mm/s and 100 mm/s.

A further important aspect of an embodiment according to the invention is using a higher feed rate than is defined by the pattern size and scanning frequency. Due to the choice of a correspondingly higher feed rate, rows are omitted, which are complemented by exposure rows of the DMD which, in temporal terms, are later.

In order to avoid washing out the exposure in the scanning direction, the exposure is interrupted and/or a local "de-scan" mechanism is used, which keeps the exposure position constant for a short time. In the following, the first possibility is considered initially.

To compensate a dose loss caused by means of a higher feed rate in particular, the light output can be increased. This requires a greater, particularly instantaneous, output of the light source, which often conflicts with increased costs or physical/technical limitations. To solve this problem, de-scanning and the dynamic splitting of the output of a light source to a plurality of exposure units can be used as a more economical variant.

During de-scanning, the relative movement of the image pixels with respect to the substrate is minimized and interrupted by a short, fast deflection (interlacing). Owing to the small jump path, this can be generated with the aid of mechano-, electro-, magneto- or acousto-optical deflection or displacement units.

During the dynamic splitting of a light source, the output of the light source is dynamically either held back (e.g. cavity-dumped laser, temperature-limited semiconductor light sources) and temporally focused, or temporally split between the consumers by means of a distributing element, such as e.g. a rotating polygonal mirror, electro-optical switch, or the like. The aim is always to keep the long-term output constant, but to increase the short-term output over the duty cycle.

Integrated Measuring Optic

The device preferably has a measuring optic, which is integrated in the optical system in particular. Particularly preferably, a ray splitter is used in order to couple the light reflected by the layer to be exposed out of the optical path with which the DMD is loaded for the exposure. The measuring optic has a plurality of important tasks which do not all have to be fulfilled at the same time:

alignment, in order to align the exposure field to structures present on the substrate or to reshape the exposure field,
calibration and checking of the write head,
in-situ check of the writing process,
real-time correction in the case of dynamic changes of the relative image substrate layer.

The alignment either takes place in relation to alignment marks already applied to the substrate or structures applied deliberately or already present, which are used as alignment marks for the structures to be exposed anew. As a result, it becomes possible according to the invention to expose large areas, in that the optical system is always aligned and/or calibrated to the structures which have already been exposed.

A further important aspect of an embodiment according to the invention is that by comparing the currently measured position of the alignment marks with the desired positions, any distortion of the substrate, caused in particular by preliminary processes and/or thermal influences, is calculated and the image to be written is adapted to this distortion. These may also be distortions of a higher order.

Specifically in the case of the prevention of seam artefacts (faults at transitions between adjacent pixels and/or adjacent exposure patterns), alignment and/or real-time correction plays an important role.

By capturing the structures (may also be surface-typical noise) of the exposure field during exposure, and comparison with a capture of adjacent exposure structures, an offset of the substrate can be determined by means of correlation or similar methods. This is applied as a fault signal to the DMD image, whereby a compensation down to the sub-pixel range is possible.

The capture/measurement preferably takes place along the same optical path, which is also used for exposure, so that a mechanical connection, particularly fixing, can be realized during the capture/measurement.

For capturing/measurement, the light signal (light ray of the at least one light source) is preferably coupled out of the surface by means of an optical element, preferably a semi-permeable mirror or a prism, and absorbed by a corresponding detector. The detector (or an evaluation system connected thereto) is then able to monitor the surface of the layer to be structured whilst it is exposed/written on. The detector is preferably a camera, more preferably a CCD or CMOS camera. The camera image can capture one or more parts, a larger area or one or more smaller sections of the exposure field. The exposure can have its own light source and take place in the same wavelength range (preferred) or in a different wavelength range of the irradiation.

In a particular extended embodiment, a measuring optic also exists on the underside of the embodiment according to the invention, with the aid of which one can detect alignment marks on the underside of the substrate holder or the substrate. The principle of underside measurement of a substrate holder is similar to the embodiment which is disclosed in the published document PCT/EP2016/070289. The measurement of alignment marks on the underside makes it possible to create structures on both sides, which are aligned with respect to one another.

Intensity Distribution Functions

In a first, particularly preferred embodiment according to the invention, an imaging/secondary optic (for influencing, particularly scaling the secondary exposure rays reflected by the DMD) is constructed in such a manner that sharp imaging of the DMD mirror in the focal plane is not achieved, but rather deliberately slightly unsharp imaging, which also exposes adjacent pixels, is achieved. As a result, it is possible to construct the optic in a considerably less expensive manner and nonetheless improve the quality of the structures created. The intensity distribution functions (intensity profiles) over the diameter of the ray can correspond to any desired mathematical function. Closed formulations are used as an approximation for more complex real distribution. Primarily conceivable in particular are:

Gaussian distribution,
Lorentzian distribution,
Cauchy distribution,
convolutions of different distribution functions.

The material of the light-sensitive layer to be exposed in particular has a defined, preferably non-linear, reaction behaviour, which primarily corresponds to the accumulated deposited quantity of light and in particular secondarily corresponds to the output and therefore the exposure behaviour. Therefore, in the case of a local exposure quantity gradient, an exposure edge is therefore formed between high and low dose, which can fluctuate within defined or definable boundaries. The presented method uses this method and allows the position of this exposure boundary to be controlled with a higher accuracy than the pixel size by overlapping a plurality of exposure fields (particularly with respect to the individual micromirrors).

For an exact positioning, the exposure power is calculated in advance in particular and broken down into a plurality of exposure elements (particularly pixels) and/or into different exposure steps. The exposure steps are temporally separated in particular and/or of different length and in sum result in a target exposure distribution at pattern level (pattern intensity profile) and/or at substrate level (substrate intensity profile). Here, the coherent and/or non-coherent overlap of the individual distribution functions (mirror intensity profiles and/or pattern intensity profiles) and/or dynamics of image creation is preferably taken into account.

The result is structuring of the exposure boundary, which is defined primarily as a sum of the exposure processes, but secondarily in the dynamic case also taking account of simulated or empirically determined material responses in the two-dimensional form thereof, but also the three-dimensional shape. In the following, the terms overlap and interference are explained in more detail.

The multiple exposure of an individual partial area can also take place both simultaneously and in a time-delayed manner. As long as the changes in the exposed material are independent of the exposure power and dependent purely on the fluence (accumulated area dose), and no mechanical changes (as due to heating or misalignment due to vibrations or displacements) take place, overlaps of exposure fields lead, by means of simple addition, to the same results as a field only exposed by one light source.

In cases, in which non-linearities occur, these can be compensated by corresponding calculations or tests and subsequent adjustments of the partial exposures. In the case of stochastic fluctuations, the overlaps lead to undesired blurs or fluctuations, which emerge as image errors (e.g. as blur).

In the case of reproducible or pre-calculable overlaps, edge roughness, jumps and other undesired effects can be minimized and a clean sewing of the exposure fields can be guaranteed. Even fluctuations of the exposure position which occur short-term can be compensated by the method according to the invention.

Interference effects occur in the optic in the case of simultaneous exposure over a plurality of ray paths, if the partial radiation sources have exactly or almost the same temporal and spatial behaviour owing to their coherence. Here, the overlaying of the fields of electromagnetic partial waves is not simply averaged, but rather also create constructive and destructive overlays in the photosensitive surfaces and volumes which are slow in relation to those in the THz range. Most often, these effects occur in the case of overlays of emission from the same source, in which the running times within the coherence time are similar—the high-frequency vibration behaviour is therefore mutually dependent. In the case of multiple exposures, photochemical interference effects can also occur, in which the successive exposure steps react with one another. These are taken into account in the control.

Preventing Failed Exposures at High Speed

In a second improved embodiment, an optimization of the data paths is carried out. A fundamental problem during the maskless exposure process is that very expensive and complex calculations (e.g. rasterization) are carried out and enormous amounts of data are saved and transmitted here. The data saved in the computer are synchronized with the relative movement between the optical system and the layer to be exposed or the DMD, with the substrate. The structural data to be imaged in/on the layer to be exposed are saved on a computer. The structural data define how the mirrors of the DMD are switched as a function of the location, in order to change the exposure ray in such a manner that the desired pattern falls onto the layer to be exposed. In the case of a whole-area or stepped embodiment, the optical system and therefore the DMD are always located at a defined, particularly fixed, position. It is not therefore necessary in this case to produce a dynamic correlation between the position and the structural data.

If however, a (preferred) scanning embodiment is used, then a continuous exposure takes place as a function of the location, in which the DMD is continuously provided with new data during the relative movement, in order to control the micromirrors as a function of the location. The data for the mirror circuit must therefore be sent to the DMD quickly enough. As the calculation of the mirror matrix is expensive, various calculations are split up according to an advantageous embodiment. A difference is made in particular between time-critical and non-time-critical calculations.

According to the invention, time-critical calculations are understood to mean all calculations which have to be carried out quickly enough, that the data reach the DMD, before it has changed its relative position in relation to the layer to be exposed.

The time-critical calculations are in particular
image calculation, particularly
DMD control
sensor measurements and feedback calculations, particularly scanning and adjustments to the current write position
decompression
particularly of data of the DMD and/or to the DMD These calculations require relatively high calculation speeds, so that a hardware calculation is preferred to a software calculation. Possible hardware components for calculation are
FPGA (field-programmable grid array)
ASIC (application-specific integrated circuit)
CPU (graphics processing unit)
Signal processor (DSP—digital signal processor)

The non-time-critical calculations are those which only change slightly during the exposure process or non-process-critical, particularly
conversion of the vector data into pixel data (rasterization), adjustments to the structural size
large-area distortion compensation
insertion of wafer- or die-specific data (e.g. serial numbers)
cutting the data into strips for an individual write head
rasterization of the vector data These calculations are usually very complex, comprise very large data ranges (particularly global adjustments) in a computing step and/or cannot be carried out particularly efficiently by means of the hardware. It makes sense for these calculations to be carried out
in at least one thread of the same computer or
in at least one thread of at least one further computer
in parallel. In this case, the threads can use the resources of the CPU and/or the GPUs of the graphics card.

The communication between the computer and the DMDs takes place via any desired interface, particularly
wired communication
USB,
Ethernet,
DisplayPort.

A first improved embodiment is based on the fact that a memory is available in the hardware for time-critical calculations, which memory is so large that at least two sections to be exposed of the layer to be exposed (particularly part sections of the exposure paths, preferably strips, more preferably parallel strips) can be saved and stored there. Whilst a section to be exposed is written from the buffer/memory, the second section to be exposed is transmitted from the computer to the unit for calculating the time-critical tasks. The exposure process of a section to be exposed first begins when the same is fully present in the memory. The second strip is generally already completely loaded into the memory before the first strip has completed its exposure process. This principle is repeated for the following strip. It is effectively prevented that no more data are available inside an exposure strip for the time-critical calculation and failed exposures occur.

Real-Time Correction of the Write Data

In a third improved embodiment, an at least partial compensation of mechanical faults takes place by means of optical elements. Should the plant according to the invention expose a continuous structure into the layer to be exposed in a scanning process, then it is advantageous to better set or provide the positional accuracy of the substrate holder than the overlay. Any position errors originate in imperfectly finished mechanical components, play and tolerances, an imperfect motor control, etc. It is relatively complex to reduce the position error by means of mechanical means. According to the design according to the invention, it is then possible to allow larger position errors as the overlay. In this case, the position error is detected using measurement technology and the DMD image is correspondingly offset, particularly in real-time. The position error is compensated in such a manner according to the invention, that the position error is smaller than the overlay specification at any point in time of the exposure process. The ratio between the overlay and the uncorrected position error is in particular smaller than 1, preferably smaller than 10, more preferably smaller than 100.

According to the invention, errors can fie compensated normal to the relative movement and in the direction of the relative movement.

In the case of errors normal to the relative movement, a somewhat narrower exposure strip is used, although the DMD is designed for the exposure of a wider exposure strip. The additional exposure regions to the left and right are therefore used as a buffer. In the case of positional deviations of the substrate holder, the exposure strip is shifted to the left or right in real-time, so that in spite of a position error, the data are exposed at the right position of the layer to be exposed.

Errors in the direction of the relative movement are compensated analogously. If the substrate holder moves too slowly, the scrolling speed (row cycle) in particular is adjusted and the intensity is compensated by means of exposure control. If the substrate holder moves too quickly, the position of the exposure image can also be adjusted by means of the scrolling speed (row cycle), a correction of the dose by adjusting the exposure time is only possible however, if exposure does not take place with maximum intensity.

The invention enables the use of an inexpensive mechanism and in spite of this achieves a high positional accuracy.

Strip Superimposition (Stitching)

In a fourth improved embodiment, the layer to be exposed is exposed in such a manner that the calculated exposure sections (strips in particular) are overlaid. Preferably, regions at the edge of the strips are exposed twice. In order to prevent over- or underexposure, the intensity is varied or formed such that it can be varied as a function of the position of the optical system, particularly the DMD. Preferably, the intensity profiles are then added to give a constant or at least more homogeneous intensity profile. One can consider the overlay of the strips as seams, which should be exposed in such a manner that, ideally, it is not possible to tell the difference from a whole-area exposure. A more precise description takes place in the description of FIGS. 6a-c. The strip overlay according to the invention can be created not only in that the drop in the intensity at the edge of an exposure strip is utilized, but rather in that a dynamic illumination control is used in a targeted manner, which allows the intensity in the edge regions of the exposure strip to fall continuously. As a result, the invention particularly preferably makes it possible to control the seams by means of targeted intensity control.

Descanning

In a fifth improved embodiment, the exposure process takes place in such a manner that in a first step (FIG. 131 the optical system or the DMD and the substrate travel in the same direction, particularly synchronously, more preferably simultaneously, and optionally, the light source is switched on in this process step. In a following, second process step (FIG. 14), the optical system (or the DMD) is displaced in the opposite direction to the movement direction of the substrate holder, preferably at considerably higher speed. In particular, no exposure takes place in this process step. The simultaneous movement followed by the partial return movement of the optical system is then carried out along the entire row, particularly for each further MID row. A quasi-static exposure is created by, means of the synchronous, in particular collinear, relative movement of the optical system and the substrate. As a result, the washing out of the exposure by means of the relative movement during scanning is reduced, preferably suppressed completely, and a better imaging can be achieved.

In a further improved embodiment, the exposure process takes place in such a manner that in a first step (FIG. 13), a relative movement between the optical system and the layer to be exposed takes place in a first direction. In a second process step (FIG. 15), running simultaneously in particular, the optical system (or the DMD) is displaced in a second direction, deviating from the first direction, particularly arranged normal to the first direction. Preferably, this displacement takes place in smaller steps than the imaging width of an individual pixel, as a result of which a considerably finer positioning pattern of the imaging points is created. The simultaneous movement followed by the lateral movement of the optical system likewise allows an increase in the positional accuracy or the overlay. Due to the synchronous, particularly non-collinear, relative movement of the optical system and substrate, the washing out of the exposure by means of the relative movement during scanning is reduced, preferably suppressed completely, and a better imaging can be achieved.

In the embodiment according to the invention, all elements which are used for image creation, particularly the optical elements, are adjusted by means of piezo elements. Electro-/acousto-/mechano-optical elements can be used in particular. The image is displaced in the x and/or y and/or z direction by means of the control. A plurality of elements can also be used, which can carry out translational and/or rotational movements of the image in particular. The image can be tracked at a speed corresponding to the scanning speed.

Simultaneous Exposure of Different Structures on Different Focal Planes.

In a sixth improved and preferred embodiment, the focal plane is tilted with respect to the layer to be exposed. During an exposure, the position of the focal plane and the depth of focus are of fundamental importance for the quality of the structure imaged. The focal plane can be tilted in numerous ways.

In a first development of the sixth embodiment, the focal plane is changed by mechanically tilting the entire DMD. This embodiment is the least preferred.

In a second, more preferred development of the sixth embodiment, the focal plane is influenced by means of a targeted change to the optical elements which are connected upstream and/or downstream of the DMD. The tilting of the focal plane is effected by means of optical elements. Preferably, the focal plane is statically set once and the different regions of the DMD are used in order to expose different depths in the layer to be exposed.

In a third development of the sixth embodiment according to the invention, a plurality of light sources of different wavelengths and/or light sources with a broad wavelength spectrum are used in order to create a plurality of, in particular continuous, focal planes in the layer to be exposed (or through the layer to be exposed).

In this embodiment, the layer to be exposed is preferably formed from a material, particularly polymer, which is sensitive for the corresponding radiation over the entire wavelength range.

Dynamic Exposure Control for Greyscale Lithography

In a seventh, improved embodiment, the intensity is controlled in a targeted manner at each position by means of one of the following methods. As a result, over- and/or underexposures can be compensated. Furthermore, structures of lower quality can be improved or exposure gradients can be created. By means of the targeted control of the intensity at each position
  3D structures
  greyscale lithography and/or
  optical proximity correction
can be created in particular.

A fundamentally important aspect in the use of DMDs is that the intensity of the photons, which impinge onto the layer to be exposed, are distributed in a spatially correct manner. As no light source constitutes an ideal spotlight, no light source has a homogeneous intensity distribution either. Consequently, the light ray, which impinges onto the DMD, is also inhomogeneous. This light ray is preferably homogenized by means of optical elements in the optical system before impingement onto the DMD.

According to the invention, not only is the homogeneity of the light source modified, rather the DMD (particularly the micromirrors thereof) is adjusted for a reflected ray with correct intensity distribution onto the layer to be exposed. In order to correctly control a complex spatial intensity distribution correctly, there are a plurality of advantageous measures.

The output of the light source in particular lies between 0.01 watt and 1000 watts, preferably between 0.1 watt and 500 watts, more preferably between 1 watt and 250 watts, most preferably between 5 watts and 100 watts, most preferably between 9 and 13 watts.

The intensity is specified in $W/m^2$. By bundling the radiation by means of optical elements onto a unit area, the intensity can easily be calculated accordingly. The intensity of the light source can preferably be regulated very precisely. The intensity is changed either by changing the output of the light source, by means of the duration of the exposure and/or by means of optical elements in the optical system. As a result, it becomes possible according to the invention to irradiate light rays of different intensity onto the DMD within a well-defined time period. By means of a corresponding mirror control, individual points of the layer to be exposed can thus be irradiated with defined intensities. The surrounding points of the layer to be exposed can be illuminated using an intensity different therefrom.

According to the invention, there is the possibility of the exposure of the layer to be exposed, which is resolved in a targeted, punctiform (particularly related to individual pixels) manner. By means of a relative movement between the optical system and the layer to be exposed, each position can be travelled to numerous times, as a result of which each pixel to be exposed can be exposed multiple times. By means of a measurement by means of a measuring system and targeted analysis of the quality of the surface, the multiple exposure can be controlled in such a manner that an optimally homogeneous exposure down to below the pixel level can be achieved.

Thus, on the one hand intensity inhomogeneities from the primary ray can be compensated, as long as a homogeneous pixel exposure is desired, on the other hand exposure doses that are different in a location-based manner can be introduced into the layer to be exposed.

It is furthermore possible by means of the mentioned embodiments according to the invention to overlap the exposure sections (strips in particular) to be exposed. Individual pixels are exposed multiple times by means of an overlap. Starting from the number of exposures per pixel, it is possible to calculate the desired intensity portion, with which the pixel is exposed, for each individual exposure process.

If structures with an intensity gradient should be imaged, it is determined according to the invention in particular, how often a pixel should be exposed with which intensity, so that each pixel has been loaded with the determined absolute intensity at the end of the exposure process in the case of n-times repetition.

Anisotropic and/or Distorted Imaging Optic for Improving Overlay Error and/or Motion Blur In a further, eighth embodiment according to the invention, horizontal and/or vertical exposure pattern grid lines of the exposure pattern are imaged differently by the optical imaging (that is to say not quadratically in particular), so that a different exposure pattern resolution is set in the vertical and horizontal direction. The calculation/control of the exposure is compensated by the deviation.

In a further embodiment, the axes of the imaging or the exposure pattern grid lines are not arranged orthogonally, but rather in an obliquely running manner. The use of such a, particularly affinely distorted, projection (particularly a shear) allows a simple calculation of the irradiation positions and linear guiding under precise placement of the illumination points below the raster resolution (sub-pixel accuracy) for highly accurate formation of the exposure edges.

In further embodiments according to the invention, the horizontal and/or the vertical exposure pattern grid lines of the exposure pattern along the vertical and/or horizontal direction are not realized equidistantly.

The different exposure patterns can be created from a homogeneously isotropic image of the DMD by means of the optical elements connected upstream and/or downstream of the DMD and/or are a direct result of an anisotropically and/or inhomogeneously constructed DMD.

In addition, a few possibilities are shown, in order to create a corresponding projection according to the invention, particularly shear of the exposure pattern.

In a first possible embodiment according to the invention, at least one cylindrical lens with a cylindrical axis is used as imaging optic, in order to effect a change of the exposure pattern. Exactly two cylindrical lenses are used in particular. The cylindrical axes of the cylindrical lenses preferably lie parallel to the surface to be exposed. In order to achieve a shear according to the invention, an angle smaller than 90°, preferably smaller than 70°, more preferably smaller than 50°, most preferably smaller than 20° is set between the two cylindrical axes. The most preferred angle of all results from the shear angle to be created, however.

In a further embodiment according to the invention, the optical system is comprised of only a single so-called compound lens. A compound lens is understood to mean a lens, the surface of which is ground in such a manner that the optical properties are identical to the optical properties which one would obtain by combining two lenses.

The above-specified embodiments can therefore be achieved both with regular, but also irregular irradiation of the substrate. In the specific case of a repetition rate of the exposure which is regular, but does not exactly integrally match the travel speed, the exposure structures are furthermore activated for the current write position exactly. Accordingly, non-integral offsets for sub-pixel placements result in the travel direction, which result in an improved placement accuracy and also edge roughness.

A combination of the above-described geometric and/or temporal displacements creates a sub-pixel resolution in all directions and reduces the susceptibility to errors compared to failures of individual exposure components. Knowledge of distortions caused by imaging errors and/or artificially is required in order to characterize the correct exposure dose distribution. Linearly distorted or rotated images have the advantage of simpler calculation and simpler light-source control.

Reduction of Motion Blur

In a further, ninth embodiment according to the invention, the relative speed and/or movement between the optical system and the layer to be exposed is changed in such a manner that a plurality of pixels overlay within the size of a pixel. The overlay can be interpreted as a long-term exposure of a moved object. As a result, there is a washing out of the pixel created in the relative movement direction. Due to the determination of when one of the pixels is written or not written, the pixel size can be set in a targeted manner in the relative movement direction. For clarification, see FIGS. 8a-b or the corresponding description of the figures.

In other words, two exposure patterns illuminated sequentially one behind the other are displaced/moved with a relative displacement between the micromirror device and the light-sensitive layer of less than one pixel width, preferably less than half of a pixel width, more preferably less than a quarter of a pixel width, of the pixels.

If the reduction in size or enlargement of the optic is chosen to be considerably smaller in the scanning direction than in the direction orthogonal thereto, the effect of the motion blur arising owing to the finite exposure time can be compensated in part. This makes it possible to achieve an isotropic imaging. The compression in the movement direction does not reduce the motion blur itself, but rather only the total extent of the exposure spot in the direction of travel.

All of the embodiments and processes according to the invention mentioned can be combined with one another as desired, but are described individually. Insofar as method features are described, these should also be considered as disclosed as device features, and vice versa.

Further advantages, features and details of the invention result from the following description of preferred exemplary embodiments, as well as on the basis of the drawings.

BRIEF DESCRIPTION OF THE DRAWINGS

FIG. 3 shows a third embodiment of the device according to the invention,

FIG. 4a shows a schematic illustration, which is not true-to-scale, of a DMD (micromirror device j with an enlarged part section with micromirrors in a first position, FIG. 4b shows a schematic illustration, which is not true-to-scale, of a DMD (micromirror device) with an enlarged part section with micromirrors in a second position, FIG. 5a shows a schematic illustration, which is not true-to-scale, of a plan view onto a first exposed section of a layer to be exposed, FIG. 5b shows a schematic illustration, which is not true-to-scale, of a plan view onto a second exposed section of the layer to be exposed, which is slightly offset with respect to the first, FIG. 6a shows a schematic illustration, which is not true-to-scale, of a plan view onto a substrate with a first exposed section, FIG. 6b shows a schematic illustration, which is not true-to-scale, of a plan view onto a substrate with a second exposed section, FIG. 6c shows a schematic illustration, which is not true-to-scale, of a plan view onto a substrate with the overlaid first and second exposed sections, FIG. 7a shows a schematic illustration, which is not true-to-scale, of a further embodiment of the device according to the invention, FIG. 7b shows a schematic illustration, which is not true-to-scale, of a further embodiment of the device according to the invention, FIG. 7c shows a schematic illustration, which is not true-to-scale, of a further embodiment of the device according to the invention, FIG. 8a shows a schematic illustration, which is not true-to-scale, of a plan view onto a further exposed section of a layer to be exposed according to a first embodiment of the method according to the invention, FIG. 8b shows a schematic illustration, which is not true-to-scale, of a plan view onto a further exposed section of a layer to be exposed according to a second embodiment of the method according to the invention, FIG. 9a shows a schematic enlarged view, which is not true-to-scale, of a first embodiment of an exposure pattern according to the invention, FIG. 9h shows a schematic enlarged view, which is not true-to-scale, of a first embodiment of an exposure pattern according to the invention, FIG. 10 shows a schematic view of an intensity distribution of two adjacent pixels with three different intensity strengths, FIG. 11 shows a schematic view of an exposure pattern with a plurality of exposed pixels, and FIG. 12 shows a schematic view of an exposure pattern distorted by optical elements.

In the figures, the same components or components with the same function are labelled with the same reference numbers.

DETAILED DESCRIPTION OF THE INVENTION

Figure 1:
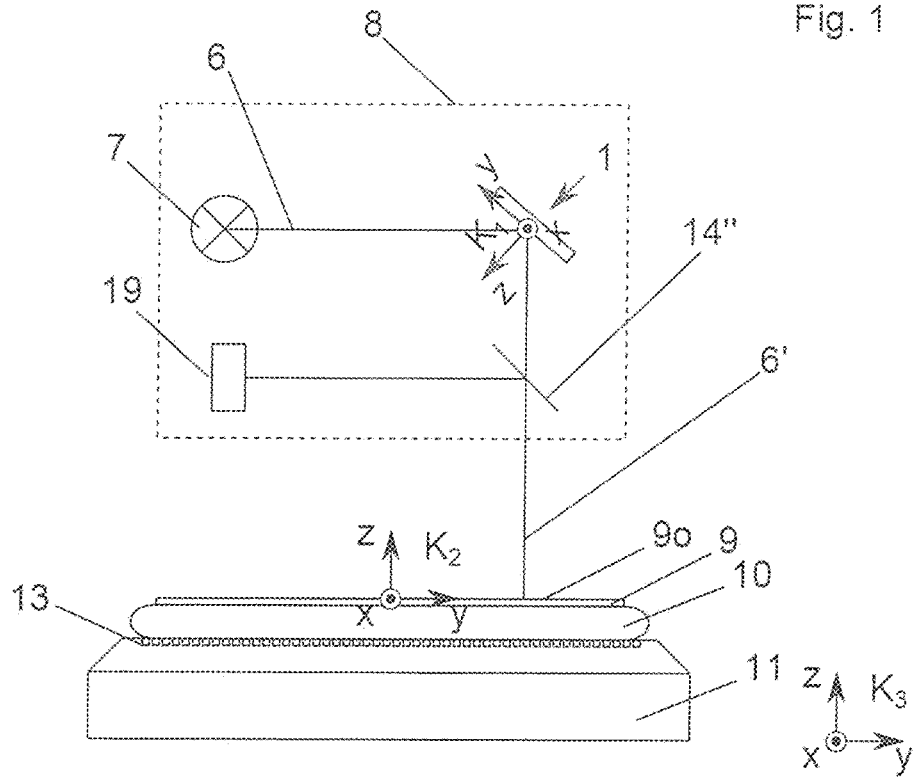
FIG. 1 shows a first embodiment of the device according to the invention.

FIG. 1 shows a first embodiment, comprised of an optical system 8, having at least one light source 7 and at least one DMD 1 (mircromirror device), a substrate holder 11. The substrate holder 11 can be moved in relation to a coordinate system K3.

A substrate 10 is fixed on the substrate holder 11 using fixing means 13, on which substrate a light-sensitive layer 9 made from a material which can be exposed is located, which layer is exposed by means of the device.

The coordinate origin of a sample-fixed coordinate system K2 (that is to say fixed to the substrate 10 or the layer 9 to be exposed) is preferably placed in the centre of the surface 90 of the layer 9.

A light ray 6 (primary light ray), which is emitted by the light source 7, and can pass a plurality of optical elements (not marked) on the way to the DMD 1, is converted by the DMD 1 into a structured light ray 6' (secondary light ray). This can pass a plurality of optical elements (not marked) on the way to the layer 9.

A detector 19, particularly a camera, more preferably a CCD or CMOS camera, can capture and/or measure the surface 90 of the layer 9 to be exposed by means of a semi-transparent mirror 14". The measured results are preferably used for the direct control of the method and/or calibration of the device. For the sake of clarity, the illustration of such measuring means is dispensed with in the further description of the figures and figures. The measuring means according to the invention can however be used in each mentioned embodiment according to the invention.

Figure 2:
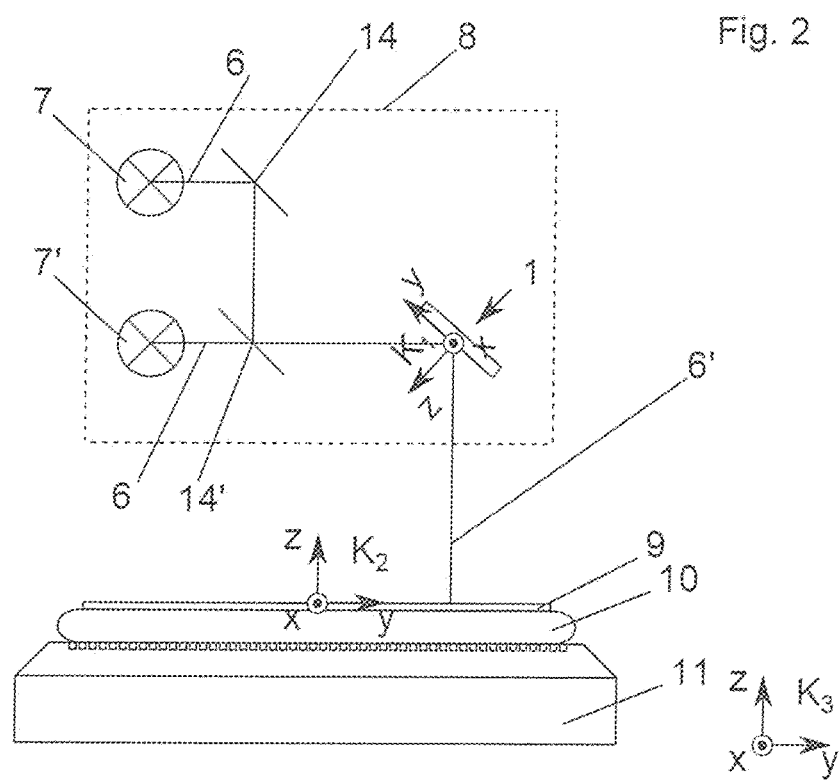
FIG. 2 shows a second embodiment of the device according to the invention.

FIG. 2 shows a second embodiment, wherein the optical system 8 is here equipped with two light sources 7, 7'. Light rays 6 are emitted by the two light sources 7, 7'. One of the light rays 6 is diverted by a mirror 14 onto a ray splitter 14' and combined with the light ray 6 of the second light source 7' by means of the same.

The combined light ray 6 is conducted onto the DMD 1 and converted by the same into a structured light ray 6', which in turn can pass a plurality of optical elements (not marked) on the way to the layer 9.

One, in particular independent, aspect according to the invention here is primarily in it being possible for the two light sources 7 to differ in terms of radiation intensity, wavelength, coherence length and, if appropriate, further properties or parameters, so that a laser ray 6 can be generated using a multiplicity of different optical parameters.

According to the invention, in particular more than 2, particularly more than 5, more preferably more than 10, most preferably more than 20 light sources 7, 7' can be used. Each light source can preferably also be an LED field or LD (laser diode) field.

FIG. 3 shows a third embodiment, comprised of an optical system 8 having at least one light source 7 and two DMDs 1.

A light ray 6 is emitted by the light source 7 and split by means of a ray splitter 14'. A first split light ray 6.1 is modified by a first DMD 1 to form a first modified ray 6.1'. The layer 9 is exposed using the first modified ray 6.1'. The second split light ray 6.2 is diverted by means of a mirror 14 onto a second DMD 1 and forwarded as a second modified ray 6.2' onto the layer 9. Preferably, a different position of the layer 9 to be exposed is exposed with the second modified ray 6.2' than with the first modified light ray 6.1'. All of the light rays mentioned can pass a plurality of optical elements (not marked).

One, in particular independent, aspect according to the invention here is at least two DMDs 1 being used, by means of which the layer 9 can be exposed at two different positions simultaneously, wherein preferably a single, particularly combined, light ray is used for loading the DMDs. This leads in particular to a propagation of the exposure section, particularly an exposure strip, and therefore to an increase of the throughput.

FIG. 4a shows the DMD 1 with a mirror surface 2. The enlarged illustration of a part of the mirror surface 2 shows a plurality of (16) mirrors 3 of a multiplicity of mirrors 3. The mirrors are arranged in a non-tilted alignment, which is designated as the initial position. A coordinate system K1 is assigned to the DMD 1. The Z axis of K1 (that is to say K1z) is normal to the mirror surface 2, the x and the y coordinates lie parallel to the mirror surface edges $2k_x$ and $2k_y$ of the mirror surface 2 and define a mirror plane.

FIG. 4b shows the same DMD 1, wherein one of the mirrors 3 is arranged in a position tilted or rotated about the x axis. The part of the light ray 6, which impinges onto the tilted mirror 3, is therefore reflected in a direction, which is not identical to the reflection direction of the parts of the light ray 6 reflected by the non-tilted mirrors 3.

FIG. 5a shows a schematic view of the mirror surface 2 with a central, particularly strip-shaped, write area 4 and two, preferably parallel, buffer regions 5 adjacent to the write area 4 at the edge in each case.

Instead of the mirrors 3, the pixels 23 reflected by the mirror surface 2 are illustrated, which are of an exposure pattern 24 that is illustrated in FIGS. 8a and 9a and correspond to forming structures 12 at the position $K2y=12$ on the layer 9 to be exposed (possibly modified by optical elements between the DMD 1 and the layer 9 to be exposed).

According to an advantageous embodiment according to the invention, only the mirrors 3 arranged in the write area 4 are used for exposure, so that a write buffer is formed by the buffer regions 5, which is explained in the following. The centre line D runs through the fixed centre point 0 of the K2x axis of the sample coordinate system.

The FIG. 5b shows the same DMD 1, but after a relative movement in the K2y direction by 0.5 a.u. The DMD 1 is therefore located at the position K2y=12.5 a.u. At the same time, one can see that a relative movement by approx. 2 a.u. in the K2x direction has taken place. This relative movement is undesired and originates for example from a fault in the mounting. It can clearly be seen how the structure 12 has been displaced to the left in relation to the DMD coordinate system K1, in order to expose the same correctly in relation to the coordinate system K2y. The write buffer is therefore used.

The targeted programming of the DMD therefore allows the correction of mechanical faults. The substrate holder 9 therefore does not move the substrate 10 and thus the layer 9 in the direction K2y in a completely straight line, rather there is a slight displacement towards K2x during the movement in the direction K2y.

According to the invention (independent aspect of the invention), the mechanism of the substrate holder 11 is preferably not used for fault correction, rather the write area 4 and the buffer regions 5 are programmed/controlled electronically in such a manner that the structures 12 to be exposed are correspondingly displaced (here in the negative K1x direction). Thus, the electronics and/or the mechanism of the DMD 1 compensates write errors, here the mechanical fault of the substrate holder 11.

Figure 6A:
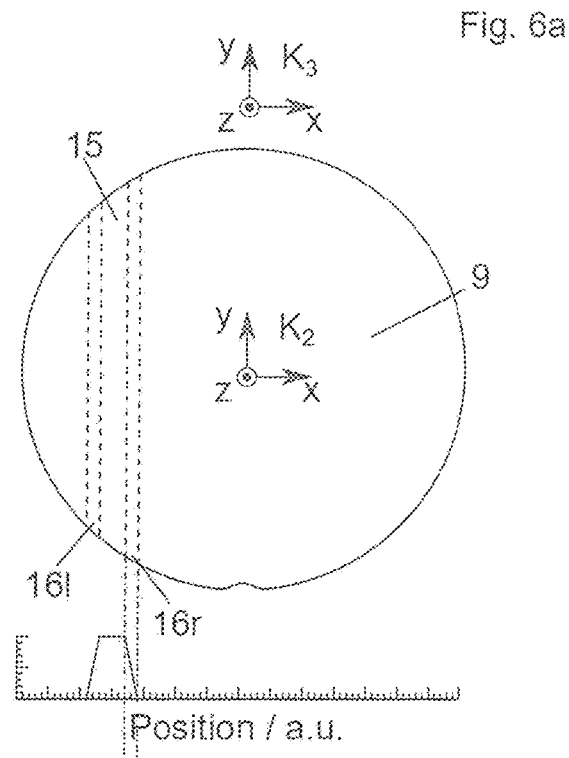

FIG. 6a shows a plan view of a layer 9 exposed along a first strip 15. The strip 15 corresponds to the area of the layer 9 exposed by means of the write area 4 of the DMD 1 after a movement of the DMD 1 relative to the exposed layer 9 in the K2y direction.

In a region between intensity variation regions 16l, 16r of the strip 15, the illuminated pixels 23 are illuminated with an intensity which is as homogeneous as possible.

By contrast, the illuminated pixels 23 in the intensity variation regions 16l, 16r are controlled in such a manner that the intensity of the reflected light ray 6' from the write area 4 in the direction of the edge of the DMD 1 falls, particularly continuously, preferably proportionally to the distance from the write area 4. A corresponding pattern intensity profile, on which one can read the intensity curve as a function of the position is marked (intensity/position). The intensity, with which the layer 9 is exposed, therefore has a maximum in the region of the strip 15 and normally falls laterally thereto, preferably steadily and/or linearly, down to zero.

Figure 6B:
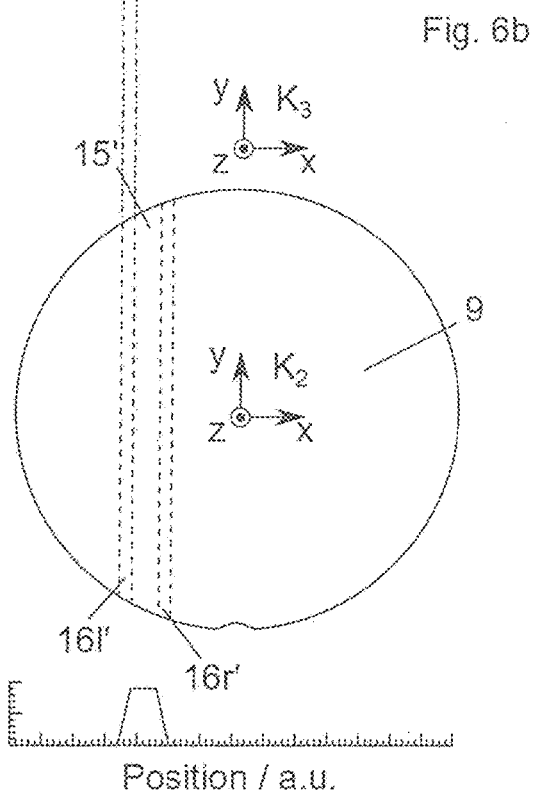

FIG. 6b shows an analogous illustration to FIG. 6a relating to a second strip 15' directly adjacent to the exposure of the first strip 15 in particular. This is displaced so far to the right compared to the first strip 15 that the right intensity variation region 16r from FIG. 6a overlaps with, preferably is congruent to, the left intensity variation region 16l' from FIG. 6b. The pixels 23 illustrated in FIGS. 5a and 5b are connected in the precisely distributed manner in the right intensity variation region 16r as in the left intensity variation region 16l', wherein the intensity of the corresponding pixels 23 illustrated in FIGS. 5a and 5b are in each case summed to give a pixel intensity which corresponds to the intensity in the strip 15.

Figure 6C:
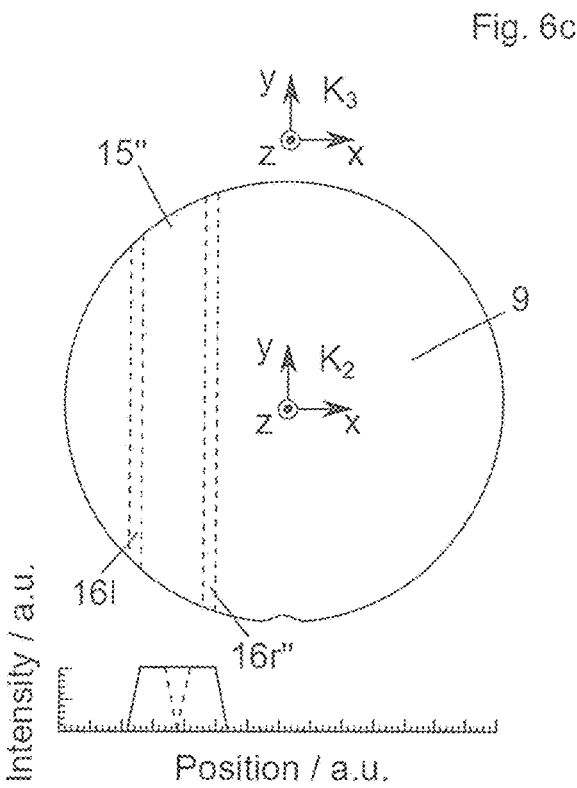

FIG. 6c shows a plan view, wherein the intensity variation region 16r of the first strip 15 is brought into congruence with the intensity variation region 16l' of the second strip 15', so that a constant intensity profile results. The exposure therefore takes place homogeneously, as the intensities of the first strip 15 are summed with the intensities of the second strip 15'.

FIG. 7a shows an enlarged section of an embodiment according to the invention having a DMD 1, optical paths of the primary light ray 6 and the secondary light ray 6' and the layer 9 to be exposed. The primary light ray 6 and the secondary light ray are here only symbolized by the optical paths 6, 6' and are preferably so large that the entire DMD 1 is illuminated. The secondary light ray 6' is normal to the layer 9 to be exposed. The focal plane 17 in particular lies parallel to the, or preferably on the, surface 9o. A depth of field range 18 indicates the depth, within which a sharp imaging of the pixels 23 can take place.

FIG. 7b shows an enlarged section of a preferred embodiment according to the invention, which is changed compared to the embodiment according to FIG. 7a. The secondary light ray 6' is reflected onto the layer 9 to be exposed at an angle α. The focal plane 17 therefore intersects the layer 9 to be exposed at the angle α. On the left side, it lies outside the layer 9 to be exposed, on the right side in the layer 9 to be exposed. The depth of field range 18 therefore penetrates deeper into the layer 9 on the right side and can therefore be used, in order to create sharp structures in three-dimensional structures in depressions, without moving the focal plane 17 in the K2z direction by moving the DMD 1.

The displacement of the DMD 1 in the K2z direction in order to be able to image deeper lying structures more sharply can in particular be avoided by tilting the DMD 1. Dynamic displacements of the exposure regions on the DMD 1 therefore allow a targeted, sharp exposure at corresponding depths. An important advantage compared to multiple exposure is the possibility of creating structures highly precisely without mechanical faults in all spatial directions.

FIG. 7c shows an enlarged section of a more preferred embodiment according to the invention, which is changed compared to the embodiments according to FIG. 7a and/or FIG. 7b. The secondary light ray 6' is deflected in such a manner by means of optical elements (not shown), which are located between the DMD 1 and the layer 9 to be exposed, that the focal plane 17 is inclined by an angle α with respect to the substrate surface 9o.

FIG. 8a shows a plan view onto a part section of the layer 9 to be exposed. A pixel 23 (smallest unit of an exposure pattern 24) was illuminated along a length l by means of the DMD 1, in that a relative movement has taken place between the DMD 1 (not shown) and the layer 9 to be exposed and an exposure of the layer 9 in the region of the width b during the entire travel along the length l has taken place by illuminating the pixel 23. The exposed regions correspond to the pixels 23, wherein the intensity of the exposure is controlled by the illumination intensity. In the case of overlaps, the intensities are summed in the overlapping regions. The exposure pattern 24 is illustrated as auxiliary lines, which one can imagine lying over the layer 9 to be exposed. The exposure pattern 24 preferably corresponds to the dimensions of the pixel 23.

The exposure took place from the K2y position 0 up to K2y position 3. Washing out in the relative movement direction is created in that a plurality of exposures take place within the range from approx. −2 to 5 during the relative movement. The intensity profiles of the pixels 23 are overlaid and generate a strong intensity increase along the path 1.

FIG. 8b shows an alternative embodiment to FIG. 8a, wherein the difference from FIG. 8a is that the smaller length 1' was created in that the corresponding mirror 3 of the DMD 1 (both not shown) first started with the exposure from the K2y position 1 and the exposure ended already from the K2y position 2. An increase in the resolution in the K2y direction is therefore possible by means of the targeted control of the mirrors 3, particularly the later switching on or earlier switching off. In the actual case, the exposure of the pixel 23' is therefore started delayed by 33.33% and ended 33.33% earlier. As it is not possible to expose the pixel 23' quadratically, as each ray has an intensity profile which deviates from a stepped-shape. An exposure pattern 24' is illustrated as auxiliary lines, which one can imagine lying over the layer 9 to be exposed. The exposure pattern 24' preferably corresponds to the dimensions of the pixel 23'.

FIG. 9a shows a first exposure pattern 24 which is less preferred according to the invention and has equidistant spacings of the exposure pattern grid lines 27 in the two mutually orthogonal directions K2x, K2y. The exposure pattern 24 is therefore isotropic and homogeneous in both directions K2x and K2y.

FIG. 9b shows a second, more preferred exposure pattern 24' according to the invention, which has a separate spacing for each direction, which is equidistant with respect to the direction in particular, between the exposure pattern grid lines 27'. The exposure pattern 24' is therefore anisotropic, but homogeneous in each of the directions K2x and K2y.

Figure 12:
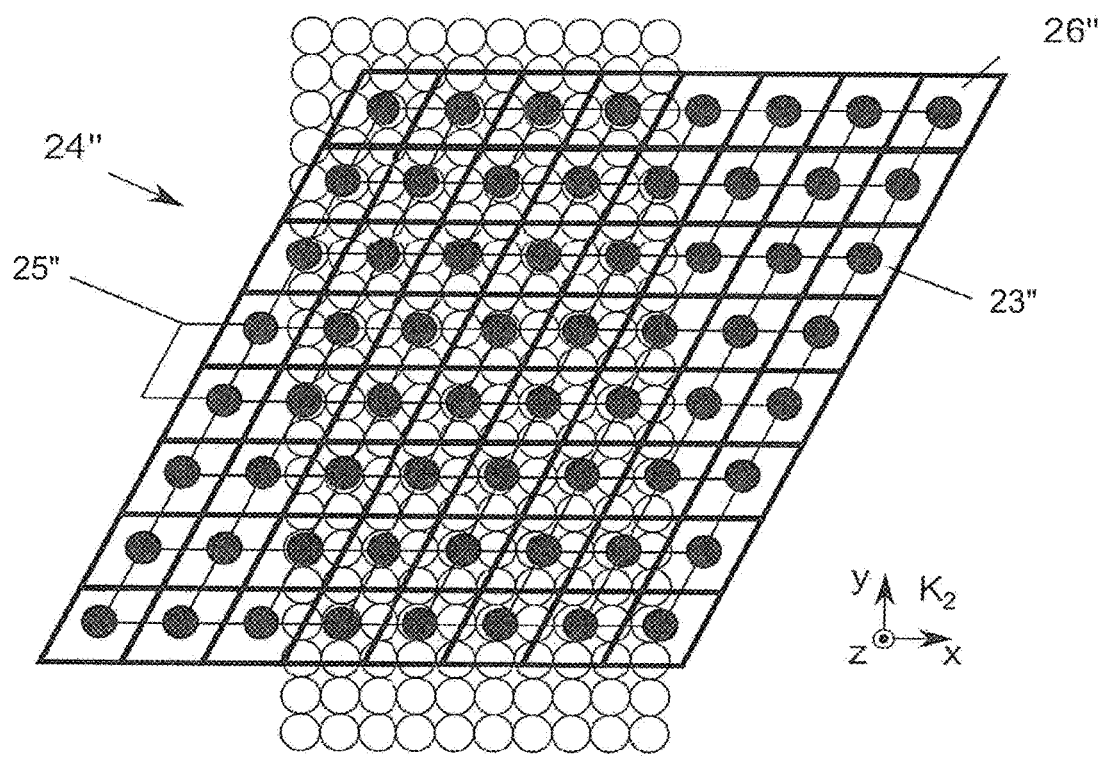
Figure 13:
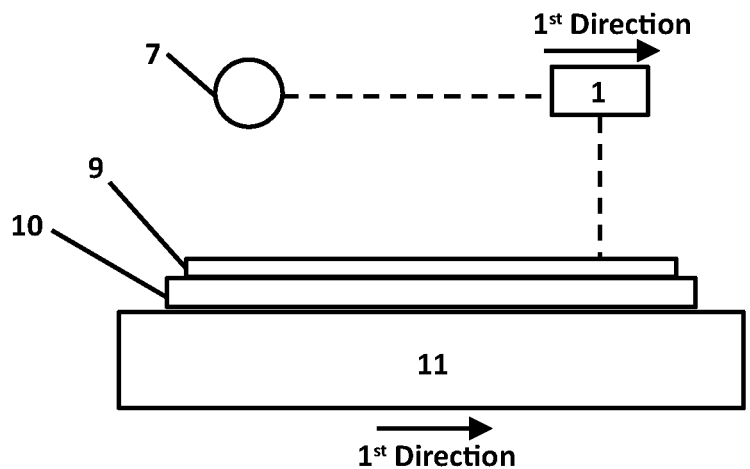
FIG. 13 shows a schematic illustration, which is not true-to-scale, of a first process step according to a fifth embodiment of the present invention (descanning)
Figure 14:
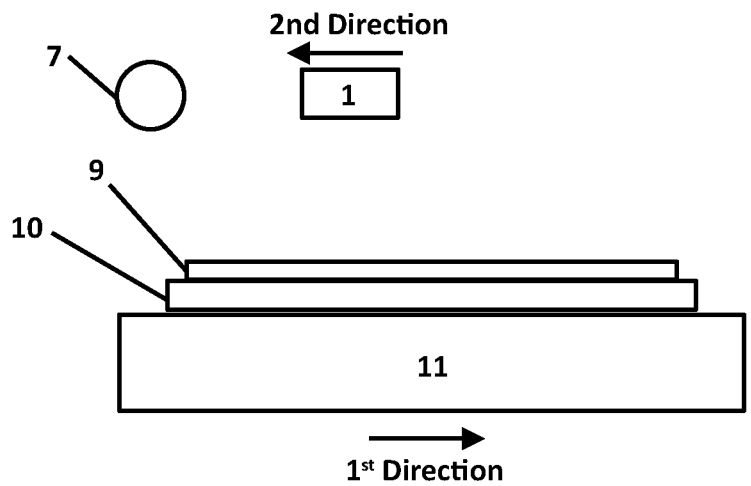
FIG. 14 shows a schematic illustration, which is not true-to-scale, of a second process step according to the fifth embodiment of the present invention (descanning)
Figure 15:
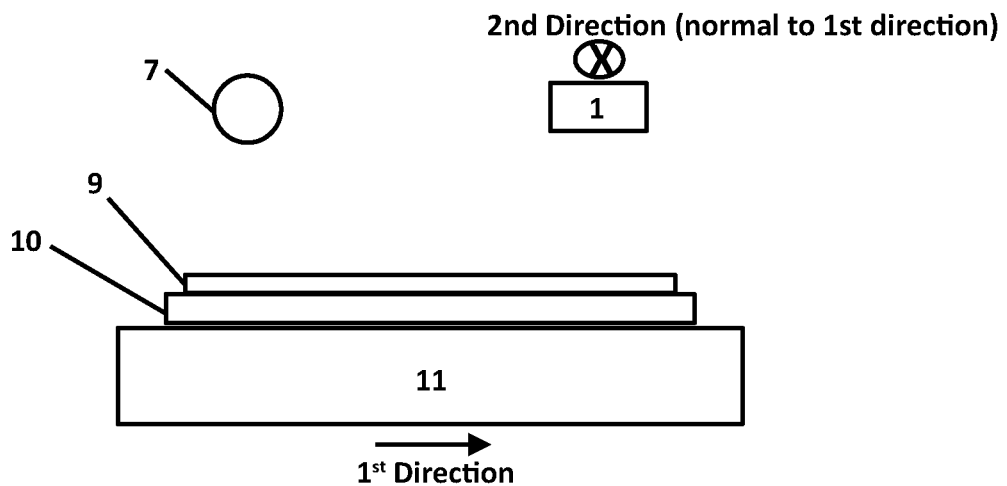
FIG. 15 shows a schematic illustration, which is not true-to-scale, of a second process step according to an improved alternative of the fifth embodiment of the present invention (descanning).

It is also conceivable that the exposure takes place at exposure pattern grid line intersection points 25, 25' (and exposure pattern grid line intersection point 25" illustrated in FIG. 12) and/or partial exposure pattern areas 26, 26' (and partial exposure pattern 26" illustrated in FIG. 12) and does not take place inside the individual pattern areas.

The different exposure patterns 24, 24' can in particular be created/modified by means of optical elements (not shown) mounted upstream and/or downstream of the DMD 1 (not shown). The DMD 1 (not shown) would preferably be isotropic and homogeneous, wherein the, particularly the downstream, optical elements (not shown) are constructed to effect an anisotropic and/or homogeneous imaging of the DMD.

FIG. 10 shows a schematic cross-sectional illustration of two mirrors 3 and also the mirror intensity profiles 22, 22', 22" (Gaussian profiles in particular) which come to pass by means of three different parameter sets and/or constructional changes to the mirrors 3, and also the pixels 23, 23', 23" created by these mirror intensity profiles 22, 22', 22". It is possible to see that the intensity distribution with increasing parameters, which characterize the distribution functions, particularly the full widths at half maximum (FWHM) FWHM, FWHM', FWHM", overlap ever more strongly, so that two mutually adjacent pixels 23, 23', 23" are washed out more strongly. The result is a very homogeneous exposure pattern in the case of the most strongly overlaid pixels 23".

Figure 11:
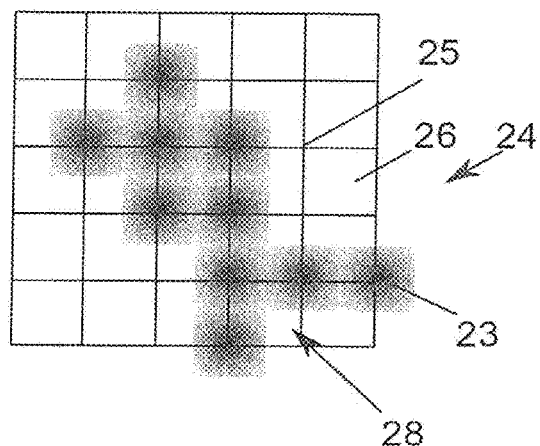

FIG. 11 shows a schematic plan view, which is not true-to-scale, of a plurality of pixels 23 on a 5×5 exposure pattern 24. A pattern 28 can be seen, which is illuminated by the targeted connection of the corresponding mirrors 3. The mirror intensity profiles of the mirrors 3 are so sharp that the intensity maxima can be seen clearly and the drop in the intensity is so stark that the intensity distribution per mirror 3 (not shown) is very strongly limited to the assigned partial exposure pattern area 26. In particularly preferred embodiments according to the invention, the mirror intensity profiles are partially overlaid beyond the partial exposure pattern area 26, as would be the case in the realization of the pixels 23" according to FIG. 1.0.

FIG. 12 shows a schematic plan view, which is not true-to-scale, of an exposure pattern 24" distorted by optical elements of the optical system 8 in particular. The partial rays reflected by the mirrors 3 of the DMD 1 are reflected orthogonally onto the layer 9 to be exposed by means of the optical elements, but a distortion takes place, preferably exclusively, within the K2x-K2y plane. An exposure pattern 24" can be created by means of this method according to the invention, which leads to an increase according to the invention of the overlay. In this embodiment, the DMD 1 is preferably not inclined, rather the original image of the DMD 1 is distorted affinely, in order to effect the inclination of the exposure pattern 24".

REFERENCE LIST

1 DMD
2 Mirror surface
2kx, 2ky Mirror surface edges
3, 3' Mirrors
Write area
Buffer region
Light ray
6' Modified/structured light ray
6.1' First modified ray
6.2' Second modified ray
7, 7' Light sources
8 Optical system
9 Layer
10 Substrate
11 Substrate holder
12, 12', 12" Structures
13 Fixing means
14 Mirror
14' Ray splitter
14" Semi-transparent mirror
15, 15', 15" Strips
16l, 16r, 16l', 16r', 16r" Intensity variation region
17 Focal plane
18 Depth of field
19 Detector
20 Dot pattern
22, 22', 22" Mirror intensity profiles
23, 23' 23" Pixels
24, 24', 24" Exposure patterns
25, 25', 25" Exposure pattern grid line intersection point
26, 26', 26" Partial exposure pattern area
27 27' Exposure pattern grid line
28 Pattern
l, l' Length
b Width
D Direction of travel
V Vertical dot pattern spacing
h Horizontal dot pattern spacing
r Exposure point radius
p Mirror centre distance Having described the invention, the following is claimed:

1. A method for exposing a light-sensitive layer of a substrate using an optical system and a substrate holder on which the substrate is fixed, the optical system including one or more light sources and one or more micromirror devices, the one or more micromirror devices respectively having one or more micromirrors, the one or more micromirrors respectively having mirror intensity profiles with regions respectively corresponding to pixels of an exposure pattern to be exposed on a partial area of the light-sensitive layer, said method comprising
- a first step of simultaneously and synchronously moving the one or more micromirror devices and the substrate in a first direction;
- emitting one or more light rays respectively from the one or more light sources during the first step for reflection by the micromirrors to expose the pixels of the exposure pattern respectively according to the regions of the mirror intensity profiles that respectively corresponding with the pixels of the exposure pattern; and
- a second step of simultaneously moving the one or more micromirror devices in a second direction and the substrate in the first direction respectively after the emitting of the one or more light rays, the second direction being different from the first direction,
- wherein the first step, the emitting, and the second step are repeated for each area of the light-sensitive layer.

2. The method according to claim 1,
wherein the pixels are larger than individual patterns of the exposure pattern.

3. The method according to claim 2, wherein the pixels are generated based on a geometric shape of the micromirrors.

4. The method according to claim 1, wherein the exposure pattern is one of two or more exposure patterns,
wherein the pixels of at least two of the two or more exposure patterns are exposed, and
wherein pattern intensity profiles of the at least two exposure patterns are overlayed as a sum to form an exposure intensity profile of the light-sensitive layer.

5. The method according to claim 4, wherein the overlaying takes place by means of unsharp imaging of the micromirrors in the exposure pattern.

6. The method according to claim 4, wherein the pixels of the at least two exposure patterns are exposed such that the at least two exposure patterns are illuminated sequentially one behind the other and are displaced with a relative displacement between a respective one of the micromirror devices and the light-sensitive layer of less than one pixel width.

7. The method according to claim 1, wherein exposure pattern grid lines of the exposure pattern are horizontal and/or are vertical, and
wherein the exposure pattern grid lines are arranged running obliquely and/or distorted.

8. The method according to claim 7, wherein the exposure pattern grid lines of the exposure pattern are horizontal and run parallel to one another, and
wherein the exposure pattern grid lines are arranged running obliquely and/or distorted.

9. The method according to claim 8, wherein the exposure pattern grid lines are arranged affinely.

10. The method according to claim 7, wherein the exposure pattern grid lines of the exposure pattern are vertical and run parallel to one another, and
wherein the exposure pattern grid lines are arranged running obliquely and/or distorted.

11. The method according to claim 10, wherein the exposure pattern grid lines are arranged affinely.

12. The method according to claim 1, wherein the second direction is opposite from the first direction.

13. The method according to claim 1, wherein the second direction is normal to the first direction.

14. The method according to claim 1, wherein, when the mirror intensity profiles further have regions respectively corresponding with areas surrounding the pixels of the exposure pattern, the exposed pixels overlap due to an overlaying of adjacent ones of the mirror intensity profiles in a time-delayed manner.

15. A device for exposing a light-sensitive layer of a substrate, said device comprising:
- a substrate holder on which the substrate is fixed, the substrate holder being configured to move the substrate in a first direction; and
- an optical system, comprising:
  - one or more micromirror devices configured to move in the first direction and a second direction the one or more micromirror devices respectively comprising one or more micromirrors, the one or more micromirrors respectively having mirror intensity profiles with regions respectively corresponding to pixels of an exposure pattern to be exposed on a partial area of the light-sensitive layer; and
  - one or more light sources respectively configured to emit one or more light rays for reflection b the micromirrors during simultaneous and synchronous movement of the substrate and the one or more micromirror devices in the first direction to expose the pixels of the exposure pattern respectively according to the regions to the mirror intensity profiles that respectively correspond with the pixels of the exposure pattern,
- wherein, at least during the respective exposure of the pixels of the exposure pattern, the one or more micromirror devices and the substrate holder respectively simultaneously and synchronously move in the first direction, and
- wherein, after the respective exposure of the pixels of the exposure pattern, the one or more micromirror devices move in the second direction simultaneously as the substrate holder moves in the first direction.

16. The device according to claim 15, wherein, when the mirror intensity profiles further have regions respectively corresponding with areas surrounding the pixels of the exposure pattern, the exposed pixels overlap due to an overlaying of adjacent ones of the mirror intensity profiles in a time-delayed manner.

* * * * *